(12) United States Patent
Sutera

(10) Patent No.: US 9,734,054 B1
(45) Date of Patent: Aug. 15, 2017

(54) EFFICIENT IMPLEMENTATION OF GEOMETRIC SERIES

(71) Applicant: Intel Corporation, Santa Clara, CA (US)

(72) Inventor: Massimo Sutera, Sunnyvale, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/162,480

(22) Filed: May 23, 2016

(51) Int. Cl.
| | |
|---|---|
| *G06F 12/06* | (2006.01) |
| *G11C 8/04* | (2006.01) |
| *G11C 5/14* | (2006.01) |
| *G11C 8/18* | (2006.01) |
| *G06F 12/02* | (2006.01) |

(52) U.S. Cl.
CPC .......... *G06F 12/06* (2013.01); *G06F 12/0292* (2013.01); *G06F 12/063* (2013.01); *G11C 5/141* (2013.01); *G11C 8/04* (2013.01); *G11C 8/18* (2013.01)

(58) Field of Classification Search
CPC ......... G11C 8/04; G11C 8/18; G06F 12/0292; G06F 12/06; G06F 12/063
See application file for complete search history.

(56) References Cited

U.S. PATENT DOCUMENTS

| | | | | |
|---|---|---|---|---|
| 3,618,031 A * | 11/1971 | Kennedy | ................... | H04L 5/02 710/63 |
| 4,128,875 A * | 12/1978 | Thurber | ................. | G06F 9/342 711/220 |
| 4,494,222 A * | 1/1985 | White | ................... | G11C 11/406 365/222 |
| 5,793,385 A * | 8/1998 | Nale | ................... | G06F 12/0292 345/542 |
| 7,548,942 B2 * | 6/2009 | Turner | ..................... | G06F 7/48 708/490 |

OTHER PUBLICATIONS

"Geometric Series", Wikipedia Entry, retrieved on Mar. 15, 2016, 11 pages, retrieved from https://en.wikipedia.org/wiki/Geometric_series.

\* cited by examiner

*Primary Examiner* — Vanthu Nguyen
(74) *Attorney, Agent, or Firm* — Alpine Technology Law Group LLC

(57) ABSTRACT

Methods and apparatus related to efficient implementation of geometric series are discussed herein. For example, memory stores data corresponding to a geometric series. Logic, coupled to the memory, generates a channel address based at least in part on a summation of a tag address and one or more geometric series components of the geometric series. Other embodiments are also claimed.

20 Claims, 11 Drawing Sheets

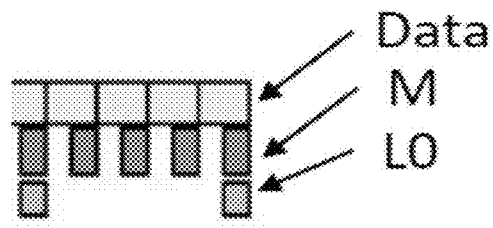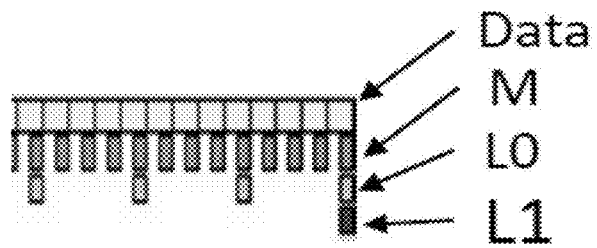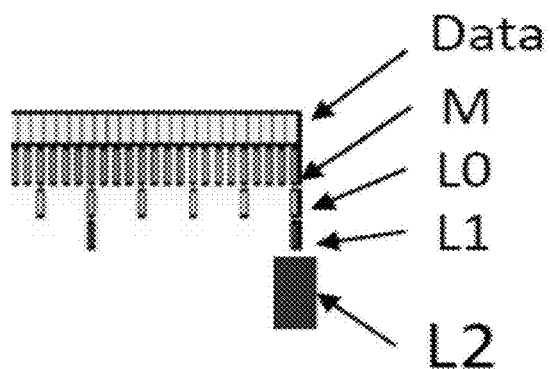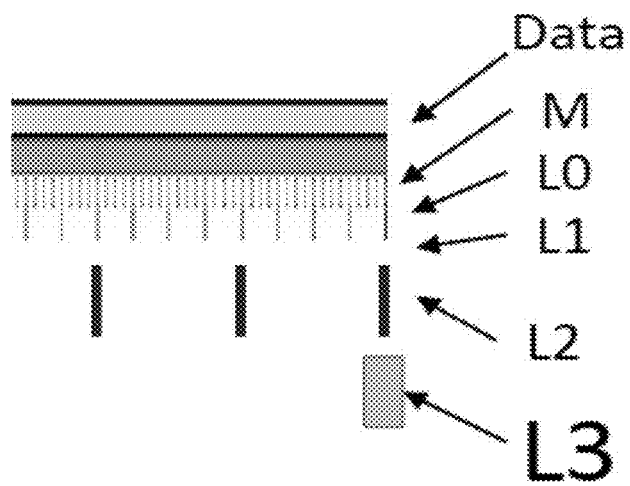
FIG. 2B1

| Inputs | | | Outputs | |
|---|---|---|---|---|
| A | B | Cin | S | Cout |
| 0 | 0 | 0 | 0 | 0 |
| 0 | 0 | 1 | 1 | 0 |
| 0 | 1 | 0 | 1 | 0 |
| 0 | 1 | 1 | 0 | 1 |
| 1 | 0 | 0 | 1 | 0 |
| 1 | 0 | 1 | 0 | 1 |
| 1 | 1 | 0 | 0 | 1 |
| 1 | 1 | 1 | 1 | 1 |

*FIG. 2E*

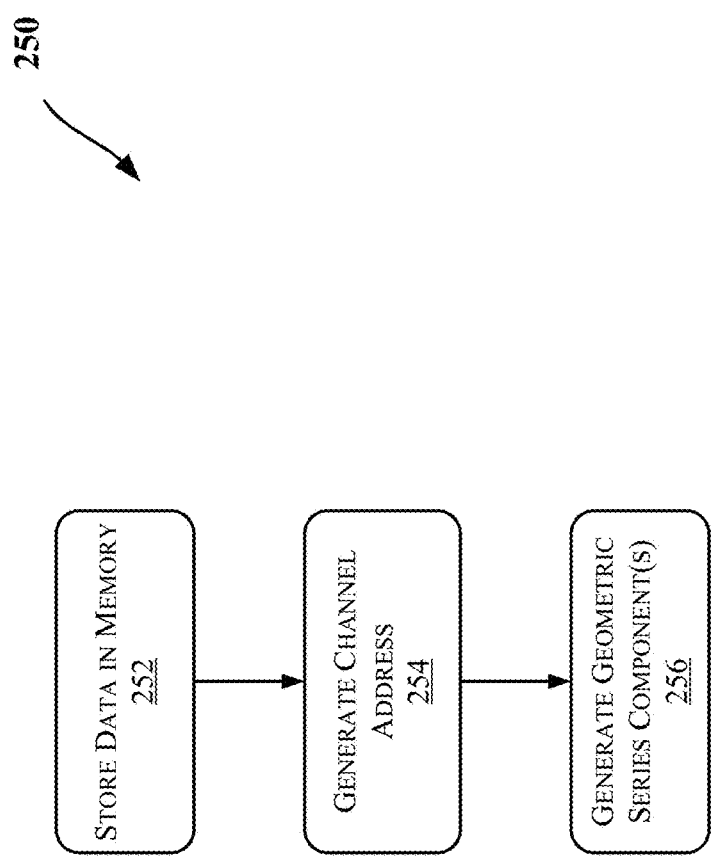

EFFICIENT IMPLEMENTATION OF GEOMETRIC SERIES

FIELD

The present disclosure generally relates to the field of electronics. More particularly, some embodiments generally relate to efficient implementation of geometric series.

BACKGROUND

Generally, memory used to store data in a computing system can be volatile (to store volatile information) or non-volatile (to store persistent information). Volatile data structures stored in volatile memory are generally used for temporary or intermediate information that is required to support the functionality of a program during the run-time of the program. On the other hand, persistent data structures stored in non-volatile (or persistent memory) are available beyond the run-time of a program and can be reused.

As computing capabilities are enhanced in processors, one concern is the speed at which memory may be accessed by a processor. For example, to process data, a processor may need to first fetch data from a memory. After completion of the data processing, the results may need to be stored in the memory. Therefore, the memory access speed can have a direct effect on overall system performance.

Another important consideration is power consumption. For example, in mobile computing devices that rely on battery power, it is very important to reduce power consumption to allow for the device to operate while mobile. Power consumption is also important for non-mobile computing devices (such as computer servers, e.g., used in a data center, etc.) as excess power consumption may increase costs (e.g., due to additional power usage, increased cooling requirements, etc.), shorten component life, or limit locations at which a device may be used.

BRIEF DESCRIPTION OF THE DRAWINGS

The detailed description is provided with reference to the accompanying figures. In the figures, the left-most digit(s) of a reference number identifies the figure in which the reference number first appears. The use of the same reference numbers in different figures indicates similar or identical items.

FIGS. 2B and 2B1 illustrate various levels of address allocation, according to some embodiments.

FIG. 2E illustrates a truth table for the circuit of FIG. 2D, according to one embodiment.

FIG. 2F illustrates a flow diagram of a method in accordance with an embodiment.

DETAILED DESCRIPTION

Figure 1:
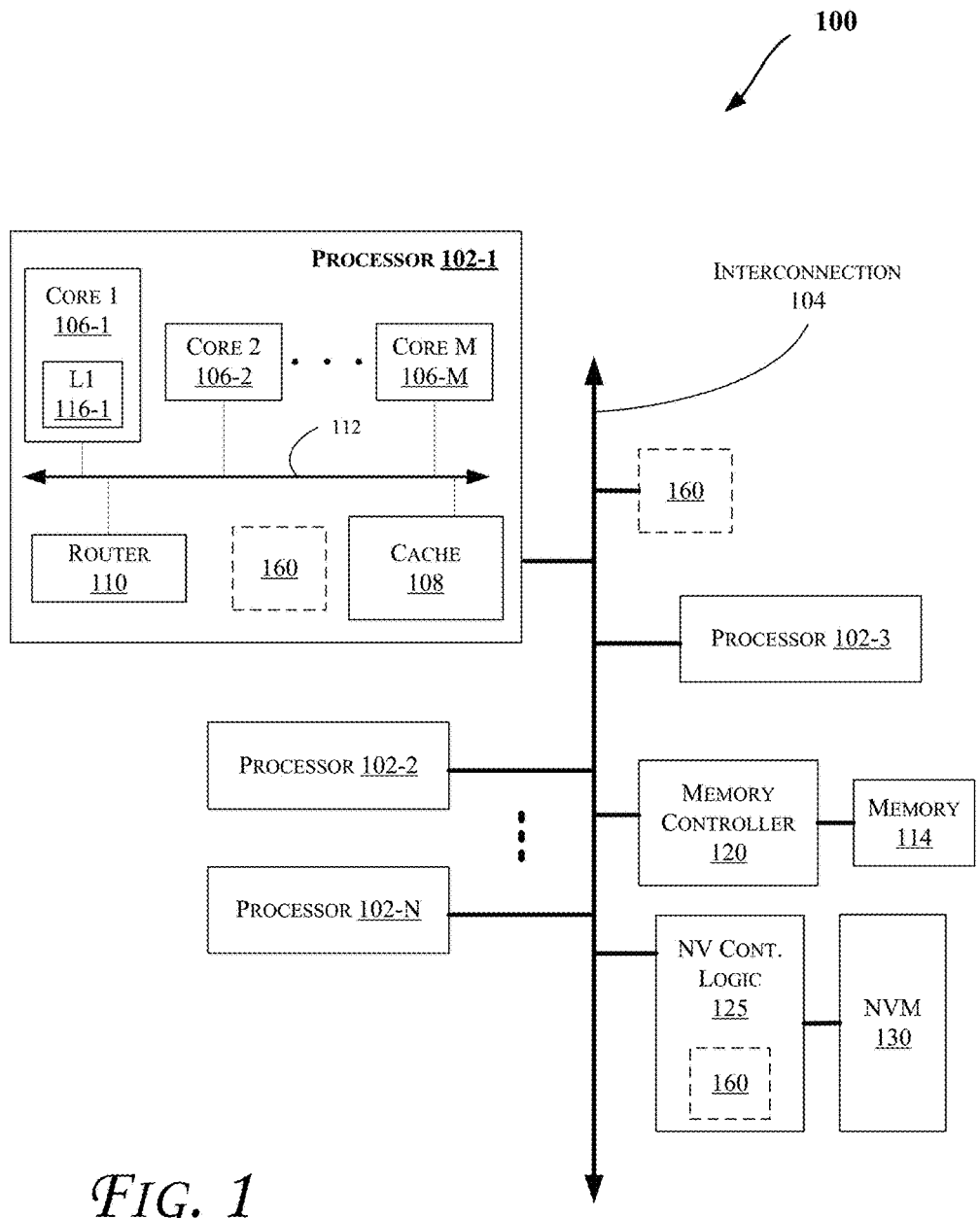
FIGS. 1 and 3-5 illustrate block diagrams of embodiments of computing systems, which may be utilized to implement various embodiments discussed herein.

In the following description, numerous specific details are set forth in order to provide a thorough understanding of various embodiments. However, various embodiments may be practiced without the specific details. In other instances, well-known methods, procedures, components, and circuits have not been described in detail so as not to obscure the particular embodiments. Further, various aspects of embodiments may be performed using various means, such as integrated semiconductor circuits ("hardware"), computer-readable instructions organized into one or more programs ("software"), or some combination of hardware and software. For the purposes of this disclosure reference to "logic" shall mean either hardware, software, firmware, or some combination thereof.

Some embodiments relate to efficient implementation of geometric series (e.g. in hardware logic). In mathematics, a geometric series is a series with a constant ratio between successive terms. Geometric series may be used for memory and/or storage solutions, e.g., to improve memory encryption operations. In an embodiment, non-volatile memory (or volatile memory) stores data corresponding to a geometric series. As discussed herein, data corresponding to a geometric series generally refers to data stored with addresses that are not linear but that follow a geometric series. This will create holes (or unused areas) in the address space, where the holes may be used to store extra information, e.g., used by a security algorithm. Logic (such as logic 160 of FIG. 1) generates a channel address based at least in part on a summation of a tag address and one or more geometric series components of the geometric series. The logic may include a plurality of two-bit adders (some of which may receive feedback signals from two-bit address that process a different bit).

Furthermore, even though some embodiments are generally discussed with reference to Non-Volatile Memory (NVM), embodiments are not limited to a single type of NVM and non-volatile memory of any type or combinations of different NVM types (e.g., including NAND and/or NOR type of memory cells) or other formats usable for memory) may be used. The memory media (whether used in DIMM (Dual Inline Memory Module) format or otherwise) can be any type of memory media including, for example, one or more of: nanowire memory, Ferro-electric Transistor Random Access Memory (FeTRAM), Magnetoresistive Random Access Memory (MRAIVI), multi-threshold level NAND flash memory, NOR flash memory, Spin Torque Transfer Random Access Memory (STTRAM), Resistive Random Access Memory, byte addressable 3-Dimensional Cross Point Memory, single or multi-level PCM (Phase Change Memory), memory devices that use chalcogenide phase change material (e.g., chalcogenide glass), or write-in-place non-volatile memory. Also, any type of Random Access Memory (RAM) such as Dynamic RAM (DRAM), backed by a power reserve (such as a battery or capacitance) to retain the data, may provide an NV memory solution. Volatile memory can include Synchronous DRAM (SDRAM). Hence, even volatile memory capable of retaining data during power failure or power disruption(s) may be used for memory in various embodiments.

The techniques discussed herein may be provided in various computing systems (e.g., including a non-mobile computing device such as a desktop, workstation, server, rack system, etc. and a mobile computing device such as a smartphone, tablet, UMPC (Ultra-Mobile Personal Computer), laptop computer, Ultrabook™ computing device, smart watch, smart glasses, smart bracelet, etc.), including those discussed with reference to FIGS. 1-5. More particularly, FIG. 1 illustrates a block diagram of a computing system 100, according to an embodiment. The system 100 may include one or more processors 102-1 through 102-N

(generally referred to herein as "processors 102" or "processor 102"). The processors 102 may communicate via an interconnection or bus 104. Each processor may include various components some of which are only discussed with reference to processor 102-1 for clarity. Accordingly, each of the remaining processors 102-2 through 102-N may include the same or similar components discussed with reference to the processor 102-1.

In an embodiment, the processor 102-1 may include one or more processor cores 106-1 through 106-M (referred to herein as "cores 106," or more generally as "core 106"), a processor cache 108 (which may be a shared cache or a private cache in various embodiments), and/or a router 110. The processor cores 106 may be implemented on a single integrated circuit (IC) chip. Moreover, the chip may include one or more shared and/or private caches (such as processor cache 108), buses or interconnections (such as a bus or interconnection 112), logic 120, memory controllers (such as those discussed with reference to FIGS. 3-5), or other components.

In one embodiment, the router 110 may be used to communicate between various components of the processor 102-1 and/or system 100. Moreover, the processor 102-1 may include more than one router 110. Furthermore, the multitude of routers 110 may be in communication to enable data routing between various components inside or outside of the processor 102-1.

The processor cache 108 may store data (e.g., including instructions) that are utilized by one or more components of the processor 102-1, such as the cores 106. For example, the processor cache 108 may locally cache data stored in a memory 114 for faster access by the components of the processor 102. As shown in FIG. 1, the memory 114 may be in communication with the processors 102 via the interconnection 104. In an embodiment, the processor cache 108 (that may be shared) may have various levels, for example, the processor cache 108 may be a mid-level cache and/or a last-level cache (LLC). Also, each of the cores 106 may include a level 1 (L1) processor cache (116-1) (generally referred to herein as "L1 processor cache 116"). Various components of the processor 102-1 may communicate with the processor cache 108 directly, through a bus (e.g., the bus 112), and/or a memory controller or hub.

As shown in FIG. 1, memory 114 may be coupled to other components of system 100 through a memory controller 120. Memory 114 includes volatile memory and may be interchangeably referred to as main memory. Even though the memory controller 120 is shown to be coupled between the interconnection 104 and the memory 114, the memory controller 120 may be located elsewhere in system 100. For example, memory controller 120 or portions of it may be provided within one of the processors 102 in some embodiments.

System 100 also includes NV memory 130 (or Non-Volatile Memory (NVM), e.g., compliant with NVMe (NVM express)) coupled to the interconnect 104 via NV controller logic 125. Hence, logic 125 may control access by various components of system 100 to the NVM 130. Furthermore, even though logic 125 is shown to be directly coupled to the interconnection 104 in FIG. 1, logic 125 may communicate via a storage bus/interconnect (such as the SATA (Serial Advanced Technology Attachment) bus, Peripheral Component Interconnect (PCI) (or PCI express (PCIe) interface), etc.) with one or more other components of system 100 (for example where the storage bus is coupled to interconnect 104 via some other logic like a bus bridge, chipset (such as discussed with reference to FIGS. 3, 4, and/or 5), etc.). Additionally, logic 125 may be incorporated into memory controller logic (such as those discussed with reference to FIGS. 3-5) or provided on a same Integrated Circuit (IC) device in various embodiments (e.g., on the same IC device as the NVM 130 or in the same enclosure as the NVM 130). System 100 may also include other types of non-volatile memory such as those discussed with reference to FIGS. 3-5, including for example a hard drive, etc.

As shown in FIG. 1, system 100 includes logic 160 to perform one or more operations for an efficient implementation of geometric series. As illustrated, logic 160 may be located in various locations in system 100; however logic 160 may be provided in other components of system 100 other than those shown.

In mathematics, a geometric series is a series with a constant ratio between successive terms. Geometric series may be used for memory and/or storage solutions. For example, the geometric series is used in the implementation of the SGX (Software Guard Extensions) functionality in the Memory Controller (MC) logic (such as those discussed herein, e.g., with reference to FIGS. 1 and/or 3-5) for memory encryption. For SGX, the memory controller stores additional information (or metadata) for every cache line data store operation in memory (referred to as IRP (Integrity and Replay Protection) data). The MEE (Memory Encryption Engine) may store additional information (metadata) in other memory locations. In previous implementations, such metadata may be stored in a fixed location, e.g., in the system address space just above the stored data. While in some implementations, the metadata may be stored in a fixed location, other locations may be used, such as interleaving the metadata in memory space interleaved with other data. Also, in accordance with at least one embodiment, memory in the system is a power of two (for example, 32 GB in an example), and the lower portion (e.g., three quarters) of memory (or 24 GB for the 32 GB example) is used for data, while the remaining data (8 GB for the 32 GB example) is used to store metadata (which may be used by the MEE as auxiliary information to protect the data). In an embodiment, the 8 GB metadata discussed in the 32 GB example is stored above the 24 GB of data.

This means that storage space for the metadata is to be pre-allocated at initialization. By contrast, in at least one embodiment, software will still see the data in a contiguous address space, with metadata on top, but in hardware, the MEE remaps the entries. As a result, metadata entries are dispersed inside the data locations (see, e.g., FIG. 2A, in which a block diagram of various data locations is illustrated, according to an embodiment). This allows the data size to grow dynamically during normal operation, with metadata allocated as needed by the size of data. This can remove the constraint to pre-allocate the metadata at initialization.

Figure 2A:
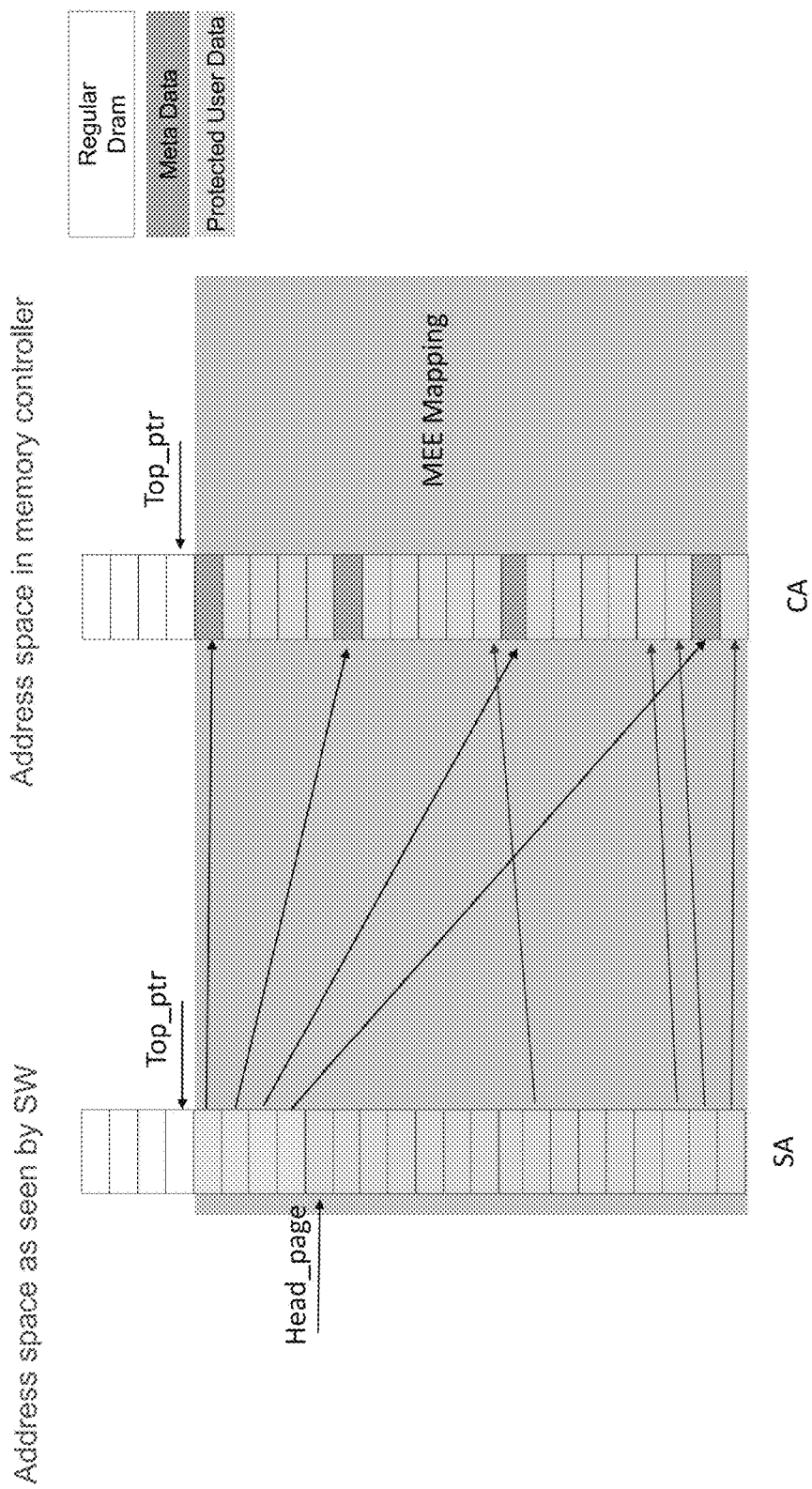
FIG. 2A illustrates a block diagram of various data locations, according to an embodiment.
Figure 2B:
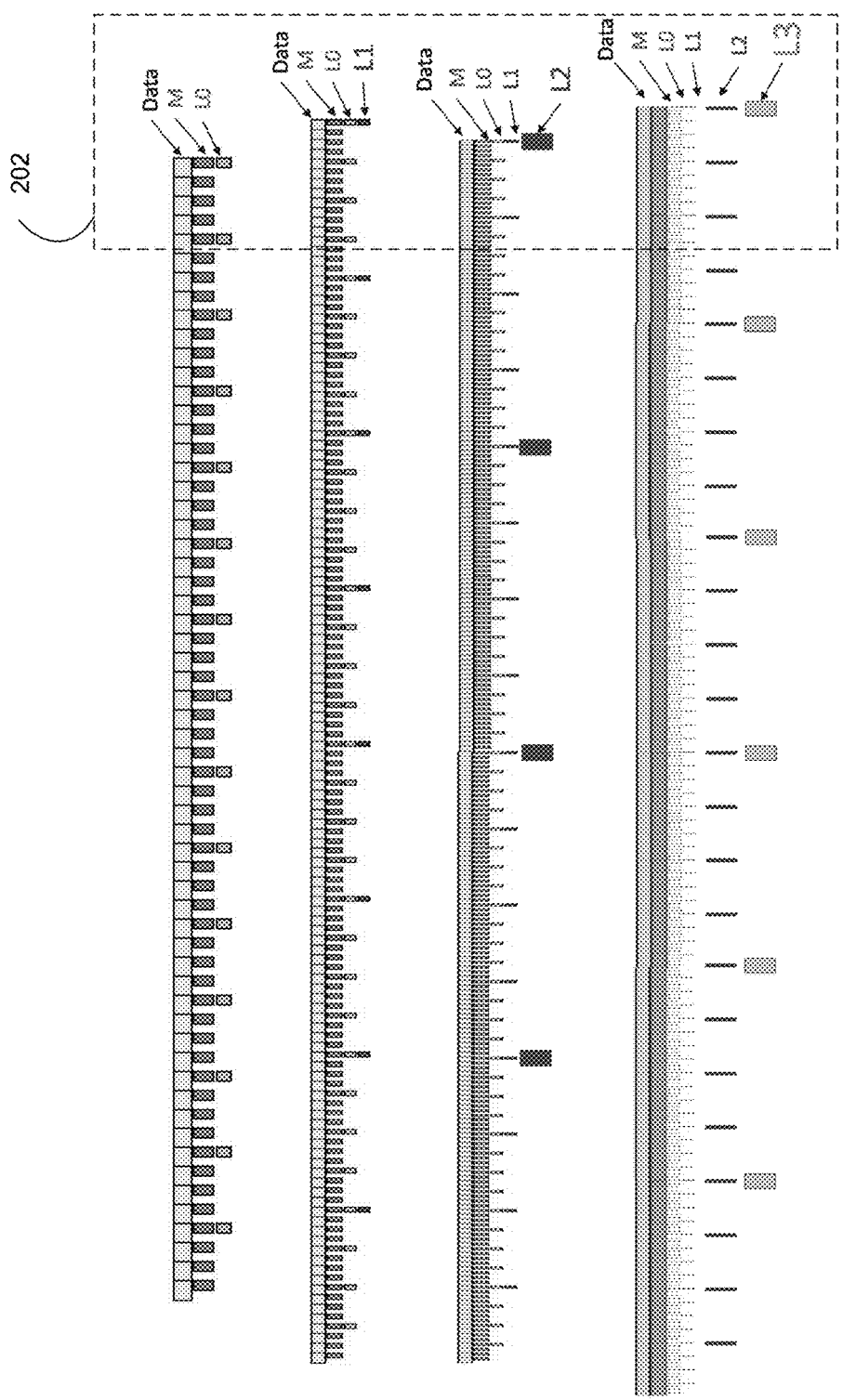

FIG. 2B illustrates various levels of address allocation, according to some embodiments. FIG. 2B1 illustrates an exploded view of a portion (202) of FIG. 2B, according to an embodiment. In FIG. 2B, each square is an address. As labeled in FIG. 2B, the top squares in each row (for L0 (level 0), L1 (level 1), L2 (level 2), and L3 (level 3)) are the addresses visible to the processor core (or secure regions that are protected). The other rows of squares (i.e., second, third, etc. rows for L0, L1, L2, and L3) are the various levels of metadata that are visible to the MEE, where such addresses may be used to store extra information to protect the secure region (the top squares visible to the processor). The metadata addresses may be interleaved with the regular addresses, e.g., one every 4 addresses. Moreover, there may be a hierarchy of metadata, whereas in FIG. 2B, they are on top of each other for ease of understanding, the row at the top of FIG. 2B shows L0 level, whereas the row at the bottom of FIG. 2B (labeled L3) shows all the levels of metadata. So, L3 is a combination of L0, L1, L2, and L3. Hence, FIG. 2B illustrates the meta data hierarchically for illustration purposes, and the various layers (e.g., L0, L1, L2, and L3) do not overlap each other and their addresses are mapped into the linear memory address space.

In some implementations of SGX with MEE design, the metadata may be inserted at a specific address range, and it follows a certain relationship with the address space allocated for SGX, or the size of the secure region is a power of 2. These can be too restrictive. By contrast, some embodiments post no such restrictions on the size of the secure region or its address space allocation. This would assist in static allocation of secure region that can be of any size. Such embodiments may also be used dynamically.

Figure 2C:
FIG. 2C illustrates a System Address to Channel Address translation scheme, according to an embodiment.

FIG. 2C illustrates a System Address (SA) to Channel Address (CA) translation scheme, according to an embodiment. TA refers to Tad Address (or input address, and Tad stands for Transaction Address) and CA refers to Channel Address (or output address) for a geometric series. TA is obtained from SA, after a constant value (Tad_offset) is subtracted. As shown, CA may be determined by adding TA to one or more components of a geometric series, where each of the components may be stored in a corresponding storage unit (where "M" stands for Metadata (such as metadata stored in memory devices 114 or 130 of FIG. 1). So, int[TA/4] may be stored in memory, while int[TA/4$^2$] may be stored in L0, int[TA/4$^3$] may be stored in L1, int[TA/4$^4$] may be stored in L2, and so forth. Also, the brackets in the formula indicate an integer part, so int[TA/4] means that the address TA is divided by 4 and then the integer part is used.

Moreover, TA is the system address after an offset (called Tad_offset) has been removed from SA. Tad_offset is a constant value that is subtracted from SA. A processor core may access an SA memory range that can start from any value, but CA is to start from an address 0 (e.g., for a DRAM device that has an address range for example for 0 to 1 GB or other value, or any device that has an address range that starts at 0). For some embodiments, TA may be considered to be a binary variable. For example, TA/4 is the variable TA divided by 4, and int[TA/4] in binary means that TA is a binary variable shifted right by two bits (or TA divided 4, i.e., shifted towards the least significant bits), int[TA/4$^2$] is TA shifted right by four bits, and so on. The last term is int[TA/4$^8$] which is TA shifted by 16 bits on the right. In an embodiment, nine terms may be used and with a base of 4, but for other embodiments any power of base two and/or any number of terms may be used.

Figure 2D:
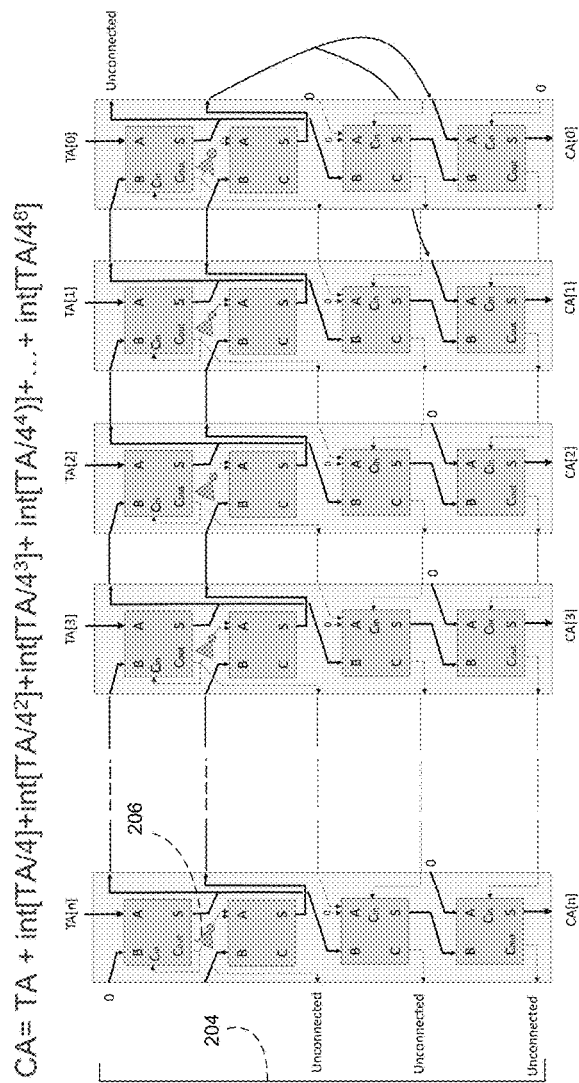
FIG. 2D illustrates a circuit diagram of a geometric series logic, according to an embodiment.

FIG. 2D illustrates a circuit diagram of a geometric series logic (such as logic 160), according to an embodiment. FIG. 2E illustrates a truth table for the circuit of FIG. 2D, according to one embodiment. In FIG. 2D, the geometric series expressions (also shown and discussed with reference to FIG. 2C) are shown above the corresponding circuitry. The small triangles between the first row and second row of adders are logic inverters. A and B are input ports, $C_{in}$ is carry in, $C_{out}$ is carry out, and S is the generated sum. This circuit is capable of calculating CA bits (labeled as CA[0] to CA[n]) from TA bits (labeled as TA[0] to TA[n], respectively). CA is a geometric series, and the embodiment of FIG. 2D allows for allocation of the secure and metadata addresses as shown previously. The circuit is constructed from two-bit adders, but it is not implemented as the usual ripple counters. More specifically, there is a feedback from the counters/adders on the left side to the counters/adders on the right side of FIG. 2D. The formulas shown in FIG. 2C may be generalized for CA(n) and TA(n), wherein n is an integer. Hence, each occurrence of CA and TA in FIG. 2C may be replaced with "CA(n)" and "TA(n)", respectively.

As shown in FIG. 2D, the above geometric series formula for the calculation from TA[n:0] to CA[n:0] may be implemented with "n" custom counters (where each custom counter includes four two-bit adders 204 and one inverter 206). With such an embodiment, the calculation may be much faster than a traditional approach (where the function of FIG. 2C is implemented with regular adders with n additions) and the semiconductor area used may also be smaller. Additionally, as more terms are added, better efficiency may be achieved. The latency with this circuit may be equivalent to two traditional adders in some implementations.

For example, to calculate the address of the metadata at the binary address: 0x01010_1111_0110, addresses for meta data are:

M address=0x01010_1111_0111
L1 address=0x01010_1111_1111
L2 address=0x01010_1111_1111

This means that the first level of metadata has the lowest 2 bits (which are 1s), and the next level has the 4 LSB (or 1s), next 6 bits, and so on.

FIG. 2F illustrates a flow diagram of a method 250 to provide efficient implementation of geometric series, according to an embodiment. In an embodiment, various components discussed with reference to the other figures may be utilized to perform one or more of the operations discussed with reference to FIG. 2F. In an embodiment, method 250 is implemented in logic such as logic 160. While various locations for logic 160 have been shown in FIGS. 3-5, embodiments are not limited to those and logic 160 may be provided in any location.

Referring to FIGS. 1-2F, at operation 252, data corresponding to a geometric series is stored in memory (e.g., in non-volatile memory). An operation 254 generates a channel address based at least in part on summation of a tag address and one or more geometric series components of the geometric series. The generating of operation 254 may be performed at a plurality of two-bit adders (such as those discussed with reference to FIG. 2D). For example, a first two-bit adder from the plurality of two-bit adders receives an output signal from a second two-bit adder from the plurality of two-bit adders, where the first two-bit adder processes a first bit of the tag address and the second two-bit adder processes a second bit of the tag address.

At operation 256, one or more geometric series components are generated based on a division of the tag address by a factor. The tag address may be generated based on a difference of a system address and an offset value. The one or more geometric series components may be generated based on an integer portion of a division of the tag address by a factor. The division of the tag address may be accomplished by shifting the tag address right as further discussed above, e.g., with reference to TA(n).

Figure 3:
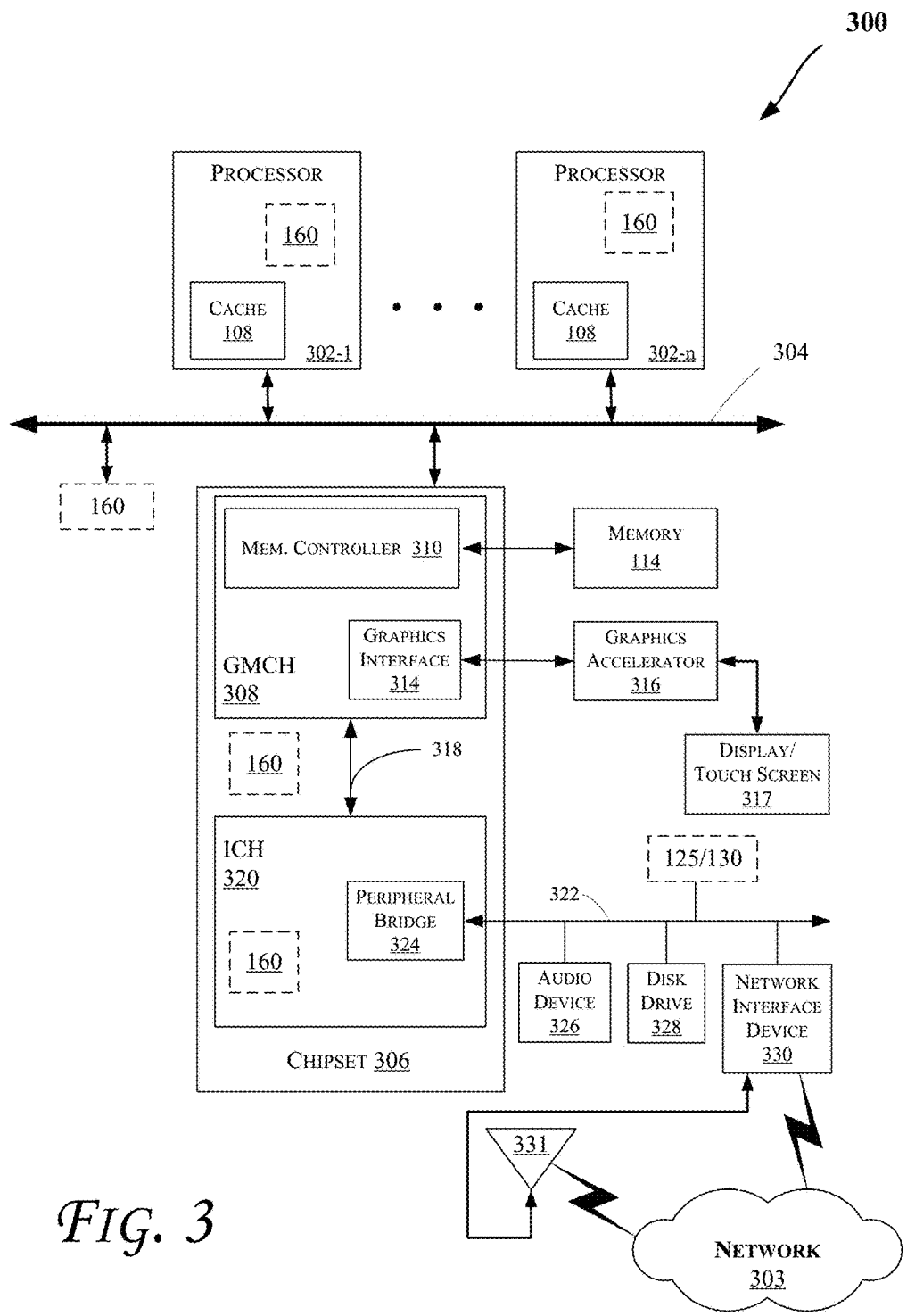

FIG. 3 illustrates a block diagram of a computing system 300 in accordance with an embodiment. The computing system 300 may include one or more central processing unit(s) (CPUs) 302 or processors that communicate via an interconnection network (or bus) 304. The processors 302 may include a general purpose processor, a network processor (that processes data communicated over a computer network 303), an application processor (such as those used in cell phones, smart phones, etc.), or other types of a processor (including a reduced instruction set computer (RISC) processor or a complex instruction set computer (CISC)).

Various types of computer networks 303 may be utilized including wired (e.g., Ethernet, Gigabit, Fiber, etc.) or wireless networks (such as cellular, including 3G (Third-Generation Cell-Phone Technology or 3rd Generation Wireless Format (UWCC)), 4G (Fourth-Generation Cell-Phone Technology), 4G Advanced, Low Power Embedded (LPE), Long Term Evolution (LTE), LTE advanced, etc.). Moreover, the processors 302 may have a single or multiple core design. The processors 302 with a multiple core design may integrate different types of processor cores on the same integrated circuit (IC) die. Also, the processors 302 with a multiple core design may be implemented as symmetrical or asymmetrical multiprocessors.

In an embodiment, one or more of the processors 302 may be the same or similar to the processors 102 of FIG. 1. For example, one or more of the processors 302 may include one or more of the cores 106 and/or processor cache 108. Also, the operations discussed with reference to FIGS. 1-2E may be performed by one or more components of the system 300.

A chipset 306 may also communicate with the interconnection network 304. The chipset 306 may include a graphics and memory control hub (GMCH) 308. The GMCH 308 may include a memory controller 310 (which may be the same or similar to the memory controller 120 of FIG. 1 in an embodiment) that communicates with the memory 114. The memory 114 may store data, including sequences of instructions that are executed by the CPU 302, or any other device included in the computing system 300. Also, system 300 includes logic 125/160 and/or NVM 130 in various locations such as shown or not shown. In one embodiment, the memory 114 may include one or more volatile memory devices such as random access memory (RAM), dynamic RAM (DRAM), synchronous DRAM (SDRAM), static RAM (SRAM), or other types of memory devices. Nonvolatile memory may also be utilized such as a hard disk drive, flash, etc., including any NVM discussed herein. Additional devices may communicate via the interconnection network 304, such as multiple CPUs and/or multiple system memories.

The GMCH 308 may also include a graphics interface 314 that communicates with a graphics accelerator 316. In one embodiment, the graphics interface 314 may communicate with the graphics accelerator 316 via an accelerated graphics port (AGP) or Peripheral Component Interconnect (PCI) (or PCI express (PCIe) interface). In an embodiment, a display 317 (such as a flat panel display, touch screen, etc.) may communicate with the graphics interface 314 through, for example, a signal converter that translates a digital representation of an image stored in a memory device such as video memory or system memory into display signals that are interpreted and displayed by the display. The display signals produced by the display device may pass through various control devices before being interpreted by and subsequently displayed on the display 317.

A hub interface 318 may allow the GMCH 308 and an input/output control hub (ICH) 320 to communicate. The ICH 320 may provide an interface to I/O devices that communicate with the computing system 300. The ICH 320 may communicate with a bus 322 through a peripheral bridge (or controller) 324, such as a peripheral component interconnect (PCI) bridge, a universal serial bus (USB) controller, or other types of peripheral bridges or controllers. The bridge 324 may provide a data path between the CPU 302 and peripheral devices. Other types of topologies may be utilized. Also, multiple buses may communicate with the ICH 320, e.g., through multiple bridges or controllers. Moreover, other peripherals in communication with the ICH 320 may include, in various embodiments, integrated drive electronics (IDE) or small computer system interface (SCSI) hard drive(s), USB port(s), a keyboard, a mouse, parallel port(s), serial port(s), floppy disk drive(s), digital output support (e.g., digital video interface (DVI)), or other devices.

The bus 322 may communicate with an audio device 326, one or more disk drive(s) 328, and a network interface device 330 (which is in communication with the computer network 303, e.g., via a wired or wireless interface). As shown, the network interface device 330 may be coupled to an antenna 331 to wirelessly (e.g., via an Institute of Electrical and Electronics Engineers (IEEE) 802.11 interface (including IEEE 802.11a/b/g/n/ac, etc.), cellular interface, 3G, 4G, LPE, etc.) communicate with the network 303. Other devices may communicate via the bus 322. Also, various components (such as the network interface device 330) may communicate with the GMCH 308 in some embodiments. In addition, the processor 302 and the GMCH 308 may be combined to form a single chip. Furthermore, the graphics accelerator 316 may be included within the GMCH 308 in other embodiments.

Furthermore, the computing system 300 may include volatile and/or nonvolatile memory. For example, nonvolatile memory may include one or more of the following: read-only memory (ROM), programmable ROM (PROM), erasable PROM (EPROM), electrically EPROM (EEPROM), a disk drive (e.g., 328), a floppy disk, a compact disk ROM (CD-ROM), a digital versatile disk (DVD), flash memory, a magneto-optical disk, or other types of nonvolatile machine-readable media that are capable of storing electronic data (e.g., including instructions).

Figure 4:
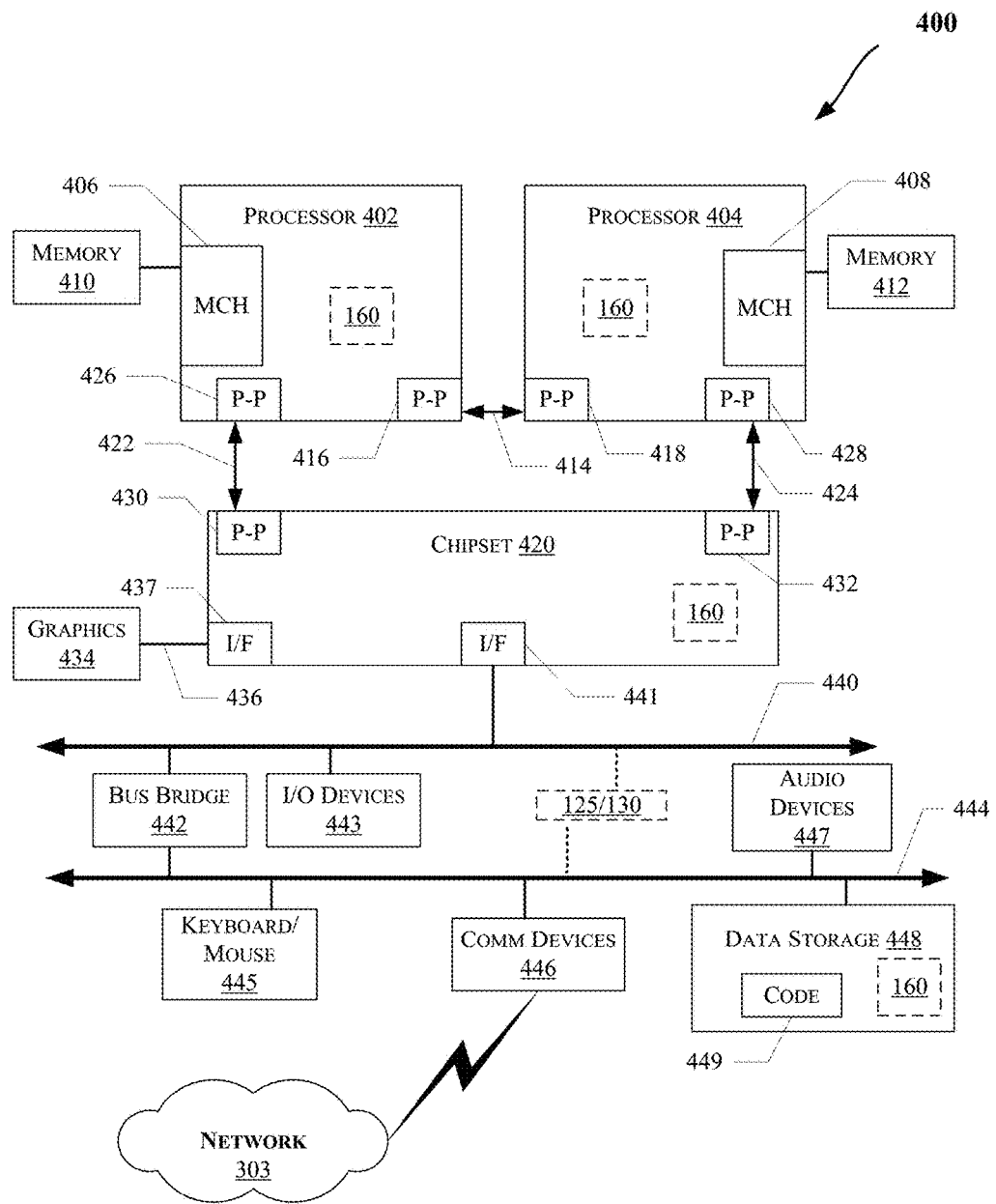

FIG. 4 illustrates a computing system 400 that is arranged in a point-to-point (PtP) configuration, according to an embodiment. In particular, FIG. 4 shows a system where processors, memory, and input/output devices are interconnected by a number of point-to-point interfaces. The operations discussed with reference to FIGS. 1-3 may be performed by one or more components of the system 400.

As illustrated in FIG. 4, the system 400 may include several processors, of which only two, processors 402 and 404 are shown for clarity. The processors 402 and 404 may each include a local memory controller hub (MCH) 406 and 408 to enable communication with memories 410 and 412. The memories 410 and/or 412 may store various data such as those discussed with reference to the memory 114 of FIGS. 1 and/or 3. Also, MCH 406 and 408 may include the memory controller 120 in some embodiments. Furthermore, system 400 includes logic 125/160 and/or NVM 130 in various locations such as shown or not shown. The logic 125/160 and/or NVM 130 may be coupled to system 400 via bus 440 or 444, via other point-to-point connections to the processor(s) 402 or 404 or chipset 420, etc. in various embodiments.

In an embodiment, the processors 402 and 404 may be one of the processors 302 discussed with reference to FIG. 3. The processors 402 and 404 may exchange data via a point-to-point (PtP) interface 414 using PtP interface circuits 416 and 418, respectively. Also, the processors 402 and 404 may each exchange data with a chipset 420 via individual PtP interfaces 422 and 424 using point-to-point interface circuits 426, 428, 430, and 432. The chipset 420 may further exchange data with a high-performance graphics circuit 434 via a high-performance graphics interface 436, e.g., using a PtP interface circuit 437. As discussed with reference to FIG. 3, the graphics interface 436 may be coupled to a display device (e.g., display 317) in some embodiments.

In one embodiment, one or more of the cores 106 and/or processor cache 108 of FIG. 1 may be located within the processors 402 and 404 (not shown). Other embodiments, however, may exist in other circuits, logic units, or devices within the system 400 of FIG. 4. Furthermore, other embodiments may be distributed throughout several circuits, logic units, or devices illustrated in FIG. 4.

The chipset 420 may communicate with a bus 440 using a PtP interface circuit 441. The bus 440 may have one or more devices that communicate with it, such as a bus bridge 442 and I/O devices 443. Via a bus 444, the bus bridge 442 may communicate with other devices such as a keyboard/mouse 445, communication devices 446 (such as modems, network interface devices, or other communication devices that may communicate with the computer network 303, as discussed with reference to network interface device 330 for example, including via antenna 331), audio I/O device, and/or a data storage device 448. The data storage device 448 may store code 449 that may be executed by the processors 402 and/or 404.

Figure 5:
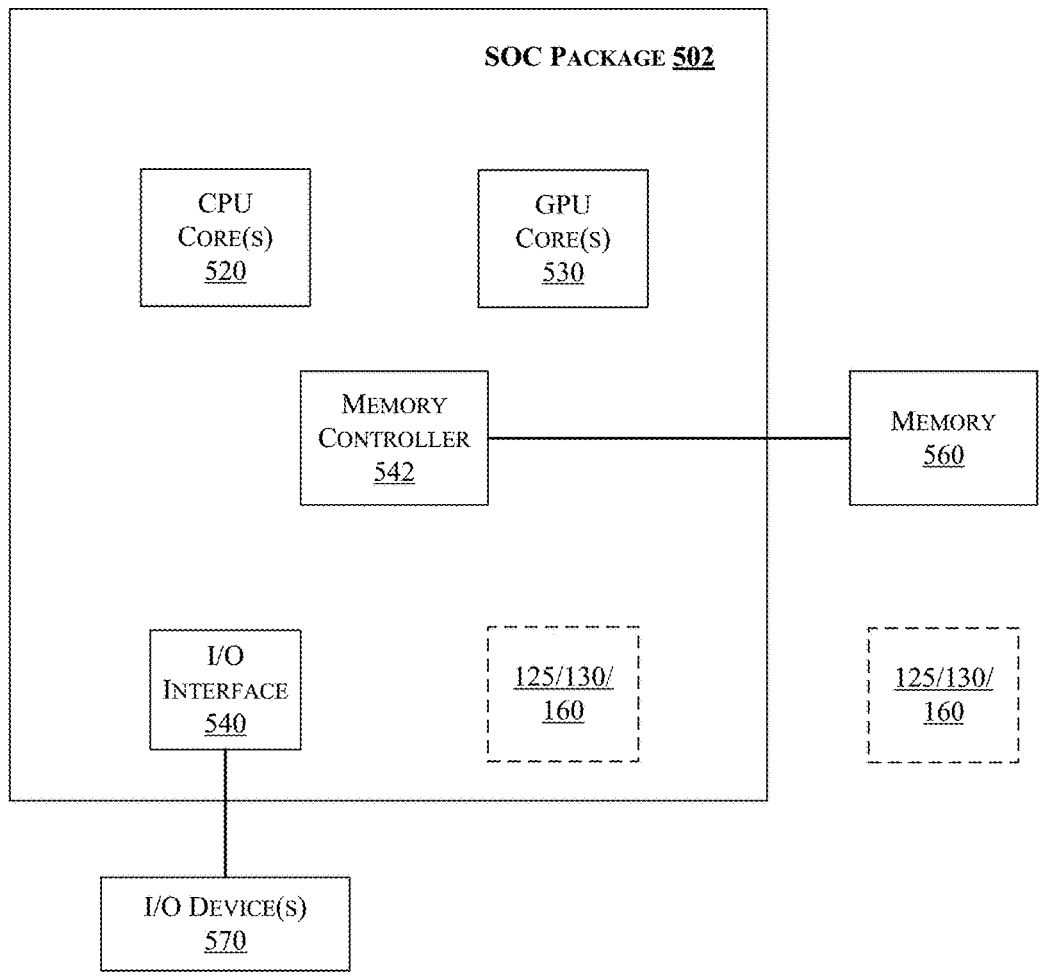

In some embodiments, one or more of the components discussed herein can be embodied as a System On Chip (SOC) device. FIG. 5 illustrates a block diagram of an SOC package in accordance with an embodiment. As illustrated in FIG. 5, SOC 502 includes one or more Central Processing Unit (CPU) cores 520, one or more Graphics Processor Unit (GPU) cores 530, an Input/Output (I/O) interface 540, and a memory controller 542. Various components of the SOC package 502 may be coupled to an interconnect or bus such as discussed herein with reference to the other figures. Also, the SOC package 502 may include more or less components, such as those discussed herein with reference to the other figures. Further, each component of the SOC package 520 may include one or more other components, e.g., as discussed with reference to the other figures herein. In one embodiment, SOC package 502 (and its components) is provided on one or more Integrated Circuit (IC) die, e.g., which are packaged onto a single semiconductor device.

As illustrated in FIG. 5, SOC package 502 is coupled to a memory 560 (which may be similar to or the same as memory discussed herein with reference to the other figures) via the memory controller 542. In an embodiment, the memory 560 (or a portion of it) can be integrated on the SOC package 502.

The I/O interface 540 may be coupled to one or more I/O devices 570, e.g., via an interconnect and/or bus such as discussed herein with reference to other figures. I/O device (s) 570 may include one or more of a keyboard, a mouse, a touchpad, a display, an image/video capture device (such as a camera or camcorder/video recorder), a touch screen, a speaker, or the like. Furthermore, SOC package 502 may include/integrate items 125, 130, and/or 160 in an embodiment. Alternatively, items 125, 130, and/or 160 may be provided outside of the SOC package 502 (i.e., as a discrete logic).

Embodiments described herein can be powered by a battery, wireless charging, a renewal energy source (e.g., solar power or motion-based charging), or when connected to a charging port or wall outlet.

The following examples pertain to further embodiments. Example 1 may optionally include an apparatus comprising: memory to store data corresponding to a geometric series; and logic, coupled to the memory, to generate a channel address based at least in part on a summation of a tag address and one or more geometric series components of the geometric series, wherein the logic is to comprise a plurality of two-bit adders, wherein a first two-bit adder from the plurality of two-bit adders is to receive an output signal from a second two-bit adder from the plurality of two-bit adders, wherein the first two-bit adder is to process a first bit of the tag address and the second two-bit adder is to process a second bit of the tag address. Example 2 may optionally include the apparatus of example 1, wherein the one or more geometric series components are to be generated based on a division of the tag address by a factor. Example 3 may optionally include the apparatus of example 1, comprising logic to generate the tag address based on a difference of a system address and an offset value. Example 4 may optionally include the apparatus of example 1, wherein the first bit of the tag address is to be fed through four two-bit adders from the plurality of two-bit adders to generate a first bit of the channel address. Example 5 may optionally include the apparatus of example 1, wherein the second bit of the tag address is to be fed through four two-bit adders from the plurality of two-bit adders to generate a second bit of the channel address. Example 6 may optionally include the apparatus of example 1, wherein the one or more geometric series components are to be generated based on an integer portion of a division of the tag address by a factor. Example 7 may optionally include the apparatus of example 6, comprising a shifter logic to shift the tag address by a number of bits corresponding to the factor. Example 8 may optionally include the apparatus of example 1, wherein the memory is to comprise one or more of: nanowire memory, Ferro-electric Transistor Random Access Memory (Fe-TRAM), Magnetoresistive Random Access Memory (MRAM), flash memory, Spin Torque Transfer Random Access Memory (STTRAM), Resistive Random Access Memory, byte addressable 3-Dimensional Cross Point Memory, PCM (Phase Change Memory), write-in-place non-volatile memory, and volatile memory backed by a power reserve to retain data during power failure or power disruption. Example 9 may optionally include the apparatus of example 1, comprising one or more of: at least one processor, having one or more processor cores, communicatively coupled to the memory, a battery communicatively coupled to the apparatus, or a network interface communicatively coupled to the apparatus.

Example 10 may optionally include a method comprising: storing data in memory, wherein the stored data corresponds to a geometric series; and generating a channel address based at least in part on a summation of a tag address and one or more geometric series components of the geometric series, wherein the generating is performed at a plurality of two-bit adders, wherein a first two-bit adder from the plurality of two-bit adders receives an output signal from a second two-bit adder from the plurality of two-bit adders, wherein the first two-bit adder processes a first bit of the tag address and the second two-bit adder processes a second bit of the tag address. Example 11 may optionally include the method of example 10, further comprising generating the one or more geometric series components based on a division of the tag address by a factor. Example 12 may optionally include the method of example 10, further comprising generating the tag address based on a difference of a system address and an offset value. Example 13 may optionally include the method of example 10, further comprising feeding the first bit of the tag address through four two-bit adders from the plurality of two-bit adders to generate a first bit of the channel address. Example 14 may optionally include the method of example 10, further comprising feeding the second bit of the tag address through four two-bit adders from the plurality of two-bit adders to generate a second bit of the channel address. Example 15 may optionally include the method of example 10, further comprising generating the one or more geometric series components based on an integer portion of a division of the tag address by a factor. Example 16 may optionally include the method of example 15, further comprising shifting the tag address by a number of bits corresponding to the factor. Example 17 may optionally include the method of example 10, wherein the memory comprises one or more of: nanowire memory, Ferro-electric Transistor Random Access Memory (FeTRAM), Magnetoresistive Random Access Memory (MRAM), flash memory, Spin Torque Transfer Random Access Memory (STTRAM), Resistive Random Access Memory, byte addressable 3-Dimensional Cross Point Memory, PCM (Phase Change Memory), write-in-place non-volatile memory, and volatile memory backed by a power reserve to retain data during power failure or power disruption.

Example 18 may include one or more computer-readable medium comprising one or more instructions that when executed on at least one processor configure the at least one processor to perform one or more operations to: store data in memory, wherein the stored data corresponds to a geometric series; and generate a channel address based at least in part on a summation of a tag address and one or more geometric series components of the geometric series, wherein the generating is performed at a plurality of two-bit adders, wherein a first two-bit adder from the plurality of two-bit adders receives an output signal from a second two-bit adder from the plurality of two-bit adders, wherein the first two-bit adder processes a first bit of the tag address and the second two-bit adder processes a second bit of the tag address. Example 19 may optionally include the computer-readable medium of example 18, further comprising one or more instructions that when executed on the processor configure the processor to perform one or more operations to generate the one or more geometric series components based on a division of the tag address by a factor. Example 20 may optionally include the computer-readable medium of example 18, further comprising one or more instructions that when executed on the processor configure the processor to perform one or more operations to generate the tag address based on a difference of a system address and an offset value. Example 21 may optionally include the computer-readable medium of example 18, further comprising one or more instructions that when executed on the processor configure the processor to perform one or more operations to feed the first bit of the tag address through four two-bit adders from the plurality of two-bit adders to generate a first bit of the channel address. Example 22 may optionally include the computer-readable medium of example 18, further comprising one or more instructions that when executed on the processor configure the processor to perform one or more operations to feed the second bit of the tag address through four two-bit adders from the plurality of two-bit adders to generate a second bit of the channel address. Example 23 may optionally include the computer-readable medium of example 18, further comprising one or more instructions that when executed on the processor configure the processor to perform one or more operations to generate the one or more geometric series components based on an integer portion of a division of the tag address by a factor. Example 24 may optionally include the computer-readable medium of example 23, further comprising one or more instructions that when executed on the processor configure the processor to perform one or more operations to shift the tag address by a number of bits corresponding to the factor. Example 25 may optionally include the computer-readable medium of example 18, wherein the memory comprises one or more of: nanowire memory, Ferro-electric Transistor Random Access Memory (FeTRAM), Magnetoresistive Random Access Memory (MRAM), flash memory, Spin Torque Transfer Random Access Memory (STTRAM), Resistive Random Access Memory, byte addressable 3-Dimensional Cross Point Memory, PCM (Phase Change Memory), write-in-place non-volatile memory, and volatile memory backed by a power reserve to retain data during power failure or power disruption.

Example 26 may optionally include a system comprising: a display device; memory to store data corresponding to a geometric series, wherein the display device is to display one or more images corresponding to the stored data; and logic, coupled to the memory, to generate a channel address based at least in part on a summation of a tag address and one or more geometric series components of the geometric series, wherein the logic is to comprise a plurality of two-bit adders, wherein a first two-bit adder from the plurality of two-bit adders is to receive an output signal from a second two-bit adder from the plurality of two-bit adders, wherein the first two-bit adder is to process a first bit of the tag address and the second two-bit adder is to process a second bit of the tag address. Example 27 may optionally include the system of example 26, wherein the one or more geometric series components are to be generated based on a division of the tag address by a factor. Example 28 may optionally include the system of example 26, comprising logic to generate the tag address based on a difference of a system address and an offset value. Example 29 may optionally include the system of example 26, wherein the first bit of the tag address is to be fed through four two-bit adders from the plurality of two-bit adders to generate a first bit of the channel address.

Example 30 may optionally include an apparatus comprising means to perform a method as set forth in any preceding example. Example 31 may comprise machine-readable storage including machine-readable instructions, when executed, to implement a method or realize an apparatus as set forth in any preceding example.

In various embodiments, the operations discussed herein, e.g., with reference to FIGS. 1-5, may be implemented as hardware (e.g., circuitry), software, firmware, microcode, or combinations thereof, which may be provided as a computer program product, e.g., including a tangible (e.g., non-transitory) machine-readable or computer-readable medium having stored thereon instructions (or software procedures) used to program a computer to perform a process discussed herein. Also, the term "logic" may include, by way of example, software, hardware, or combinations of software and hardware. The machine-readable medium may include a memory device such as those discussed with respect to FIGS. 1-5.

Additionally, such tangible computer-readable media may be downloaded as a computer program product, wherein the program may be transferred from a remote computer (e.g., a server) to a requesting computer (e.g., a client) by way of data signals (such as in a carrier wave or other propagation medium) via a communication link (e.g., a bus, a modem, or a network connection).

Reference in the specification to "one embodiment" or "an embodiment" means that a particular feature, structure, or characteristic described in connection with the embodiment may be included in at least an implementation. The appearances of the phrase "in one embodiment" in various places in the specification may or may not be all referring to the same embodiment.

Also, in the description and claims, the terms "coupled" and "connected," along with their derivatives, may be used. In some embodiments, "connected" may be used to indicate that two or more elements are in direct physical or electrical contact with each other. "Coupled" may mean that two or more elements are in direct physical or electrical contact. However, "coupled" may also mean that two or more elements may not be in direct contact with each other, but may still cooperate or interact with each other.

Thus, although embodiments have been described in language specific to structural features, numerical values, and/or methodological acts, it is to be understood that claimed subject matter may not be limited to the specific features, numerical values, or acts described. Rather, the specific features, numerical values, and acts are disclosed as sample forms of implementing the claimed subject matter.

The invention claimed is:

1. An apparatus comprising:
   memory to store data corresponding to a geometric series; and
   logic, coupled to the memory, to generate a channel address based at least in part on a summation of a tag address and one or more geometric series components of the geometric series,
   wherein the logic is to comprise a plurality of two-bit adders, wherein a first two-bit adder from the plurality of two-bit adders is to receive an output signal from a second two-bit adder from the plurality of two-bit adders, wherein the first two-bit adder is to process a first bit of the tag address and the second two-bit adder is to process a second bit of the tag address, wherein one of the first bit of the tag address or the second bit of the tag address is to be fed through four two bit adders from the plurality of two-bit adders to respectively generate a first bit of the channel address or a second bit of the channel address.

2. The apparatus of claim 1, wherein the one or more geometric series components are to be generated based on a division of the tag address by a factor.

3. The apparatus of claim 1, comprising logic to generate the tag address based on a difference of a system address and an offset value.

4. The apparatus of claim 1, wherein the one or more geometric series components are to be generated based on an integer portion of a division of the tag address by a factor.

5. The apparatus of claim 4, comprising a shifter logic to shift the tag address by a number of bits corresponding to the factor.

6. The apparatus of claim 1, wherein the memory is to comprise one or more of: nanowire memory, Ferro-electric Transistor Random Access Memory (FeTRAM), Magnetoresistive Random Access Memory (MRAM), flash memory, Spin Torque Transfer Random Access Memory (STTRAM), Resistive Random Access Memory, byte addressable 3-Dimensional Cross Point Memory, PCM (Phase Change Memory), write-in-place non-volatile memory, and volatile memory backed by a power reserve to retain data during power failure or power disruption.

7. The apparatus of claim 1, comprising one or more of: (a) at least one processor, having one or more processor cores, communicatively coupled to the memory, (h) a battery communicatively coupled to the apparatus, or (c) a network interface communicatively coupled to the apparatus.

8. A method comprising:
   storing data in memory, wherein the stored data corresponds to a geometric series; and
   generating a channel address based at least in part on a summation of a tag address and one or more geometric series components of the geometric series,
   wherein the generating is performed at a plurality of two-bit adders, wherein a first two-bit adder from the plurality of two-bit adders receives an output signal from a second two-bit adder from the plurality of two-bit adders, wherein the first two-bit adder processes a first bit of the tag address and the second two-bit adder processes a second bit of the tag address, wherein one of the first bit of the tag address or the second bit of the tag address is fed through four two bit adders from the plurality of two-bit adders to respectively generate a first bit of the channel address or a second bit of the channel address.

9. The method of claim 8, further comprising generating the one or more geometric series components based on a division of the tag address by a factor.

10. The method of claim 8, further comprising generating the tag address based on a difference of a system address and an offset value.

11. The method of claim 8, further comprising generating the one or more geometric series components based on an integer portion of a division of the tag address by a factor.

12. The method of claim 11, further comprising shifting the tag address by a number of bits corresponding to the factor.

13. The method of claim 8, wherein the memory comprises one or more of: nanowire memory, Ferro-electric Transistor Random Access Memory (FeTRAM), Magnetoresistive Random Access Memory (MRAM), flash memory, Spin Torque Transfer Random Access Memory (STTRAM), Resistive Random Access Memory, byte addressable 3-Dimensional Cross Point Memory, PCM (Phase Change Memory), write-in-place non-volatile memory, and volatile memory backed by a power reserve to retain data during power failure or power disruption.

14. One or more computer-readable medium comprising one or more instructions that when executed on at least one processor configure the at least one processor to perform one or more operations to:
   store data in memory, wherein the stored data corresponds to a geometric series; and
   generate a channel address based at least in part on a summation of a tag address and one or more geometric series components of the geometric series,
   wherein the generating is performed at a plurality of two-bit adders, wherein a first two-bit adder from the plurality of two-bit adders receives an output signal from a second two-bit adder from the plurality of two-bit adders, wherein the first two-bit adder processes a first bit of the tag address and the second two-bit adder processes a second bit of the tag address, wherein one of the first bit of the tag address or the second bit of the tag address is fed through four two bit adders from the plurality of two-bit adders to respectively generate a first bit of the channel address or a second bit of the channel address.

15. The computer-readable medium of claim 14, further comprising one or more instructions that when executed on the processor configure the processor to perform one or more operations to generate the one or more geometric series components based on a division of the tag address by a factor.

16. The computer-readable medium of claim 14, further comprising one or more instructions that when executed on the processor configure the processor to perform one or more operations to generate the tag address based on a difference of a system address and an offset value.

17. The computer-readable medium of claim 14, further comprising one or more instructions that when executed on the processor configure the processor to perform one or more operations to generate the one or more geometric series components based on an integer portion of a division of the tag address by a factor.

18. The computer-readable medium of claim 17, further comprising one or more instructions that when executed on the processor configure the processor to perform one or more operations to shift the tag address by a number of bits corresponding to the factor.

19. The computer-readable medium of claim 14, wherein the memory comprises one or more of: nanowire memory, Ferro-electric Transistor Random Access Memory (Fe-TRAM), Magnetoresistive Random Access Memory (MRAM), flash memory, Spin Torque Transfer Random Access Memory (STTRAM), Resistive Random Access Memory, byte addressable 3-Dimensional Cross Point Memory, PCM (Phase Change Memory), write-in-place non-volatile memory, and volatile memory backed by a power reserve to retain data during power failure or power disruption.

20. The method of claim 8, wherein generating the channel address is to be performed at a processor having one or more processor cores.

\* \* \* \* \*

UNITED STATES PATENT AND TRADEMARK OFFICE
CERTIFICATE OF CORRECTION

PATENT NO. : 9,734,054 B1  Page 1 of 1
APPLICATION NO. : 15/162480
DATED : August 15, 2017
INVENTOR(S) : Massimo Sutera It is certified that error appears in the above-identified patent and that said Letters Patent is hereby corrected as shown below:

In the Claims

In Column 13, in Claim 7, in Line 65 delete ""(h)"" and replace with -- (b) --

Signed and Sealed this
Twenty-fourth Day of October, 2017

Joseph Matal
*Performing the Functions and Duties of the*
*Under Secretary of Commerce for Intellectual Property and*
*Director of the United States Patent and Trademark Office*